(12) United States Patent
Hong et al.

(10) Patent No.: US 10,147,901 B2
(45) Date of Patent: Dec. 4, 2018

(54) PACKAGING METHOD, DISPLAY PANEL AND DISPLAY APPARATUS

(71) Applicant: Boe Technology Group Co., Ltd., Beijing (CN)

(72) Inventors: Rui Hong, Beijing (CN); Dan Wang, Beijing (CN); Zhengyin Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/906,028

(22) PCT Filed: Aug. 19, 2015

(86) PCT No.: PCT/CN2015/087495
§ 371 (c)(1),
(2) Date: Jan. 19, 2016

(87) PCT Pub. No.: WO2016/123957
PCT Pub. Date: Aug. 11, 2016

(65) Prior Publication Data
US 2016/0372696 A1    Dec. 22, 2016

(30) Foreign Application Priority Data
Feb. 4, 2015    (CN) .......................... 2015 1 0058588

(51) Int. Cl.
*H01L 51/56*    (2006.01)
*H01L 51/52*    (2006.01)
(Continued)

(52) U.S. Cl.
CPC ............ *H01L 51/524* (2013.01); *H01L 27/32* (2013.01); *H01L 51/0024* (2013.01);
(Continued)

(58) Field of Classification Search
CPC .......................... H01L 51/524; H01L 51/0024
(Continued)

(56) References Cited

U.S. PATENT DOCUMENTS

2005/0156320 A1*  7/2005  Mastromatteo ..... B81C 1/00238
                                                                      257/777
2007/0281404 A1* 12/2007  Lin .................. H01L 21/02422
                                                                      438/166
(Continued)

FOREIGN PATENT DOCUMENTS

CN          101095247           12/2007
CN          101192551            6/2008
(Continued)

OTHER PUBLICATIONS

Office action from Chinese Application No. 201510058588.0 dated Jun. 20, 2016.
(Continued)

*Primary Examiner* — Moazzam Hossain
*Assistant Examiner* — Omar Mojaddedi
(74) *Attorney, Agent, or Firm* — Calfee Halter & Griswold LLP

(57) ABSTRACT

A packaging method, a display panel, and a display apparatus. The packaging method comprises steps of: forming a frit layer in a packaging area of a first substrate; forming at least a metal thin film and/or at least a silicon thin film on the frit layer formed on the first substrate, and forming at least a metal thin film and/or at least a silicon thin film in a packaging area of a second substrate, wherein one of the outermost thin film formed on the frit layer and the outermost thin film formed is a metal thin film, and the other is a silicon thin film; and vacuum laminating the first substrate and the second substrate, without the use of a laser to irradiate the frit layer during the packaging.

15 Claims, 2 Drawing Sheets

(51) Int. Cl.
*H01L 27/32* (2006.01)
*H01L 51/00* (2006.01)

(52) U.S. Cl.
CPC .............. *H01L 51/52* (2013.01); *H01L 51/56* (2013.01); *H01L 2251/301* (2013.01); *H01L 2251/558* (2013.01)

(58) Field of Classification Search
USPC .......................................................... 257/88
See application file for complete search history.

(56) References Cited

U.S. PATENT DOCUMENTS

| | | | | |
|---|---|---|---|---|
| 2011/0279023 | A1* | 11/2011 | Nishioka | H01L 27/3253 313/504 |
| 2013/0318023 | A1 | 11/2013 | Morimura et al. | |
| 2014/0027743 | A1* | 1/2014 | Nishido | H01L 51/5253 257/40 |
| 2014/0054582 | A1* | 2/2014 | Yamazaki | H01L 33/0041 257/43 |
| 2014/0332827 | A1* | 11/2014 | Chang | H01L 27/1262 257/88 |
| 2015/0020466 | A1* | 1/2015 | Bouesnard | C03C 27/046 52/204.62 |
| 2015/0075618 | A1* | 3/2015 | Usui | H01G 9/2077 136/259 |
| 2015/0171365 | A1* | 6/2015 | Suga | H01L 51/5246 257/787 |
| 2015/0184446 | A1* | 7/2015 | Veerasamy | E06B 3/6775 428/34 |
| 2015/0243923 | A1* | 8/2015 | Reusch | H01L 51/5246 257/98 |
| 2016/0013441 | A1* | 1/2016 | Hong | H01L 51/5246 257/40 |

FOREIGN PATENT DOCUMENTS

| | | |
|---|---|---|
| CN | 103985727 | 8/2014 |
| CN | 104167426 | 11/2014 |
| CN | 104600222 | 5/2015 |

OTHER PUBLICATIONS

International Search Report and Written Opinion from PCT/CN15/87495 dated Oct. 29, 2015.

\* cited by examiner

PACKAGING METHOD, DISPLAY PANEL AND DISPLAY APPARATUS

RELATED APPLICATIONS

The present application is the U.S. national phase entry of PCT/CN2015/087495, with an international filing date of Aug. 19, 2015, which claims the benefit of Chinese Patent Application No. 201510058588.0, filed on Feb. 4, 2015, the entire disclosures of which are incorporated herein by reference.

FIELD OF THE INVENTION

The present invention relates to the field of display, and in particular to a packaging method, a display panel and a display apparatus.

BACKGROUND ART

In recent years, the organic light emitting diode (OLED) display has been an emerging flat panel display of interest. However, the performance of a traditional OLEDs, especially the low work-function electrode and the organic function layer disposed therein, can be easily deteriorate as oxygen and vapor in the ambient environment enter the OLED display, which may seriously affect the service lifetime of the OLED. To solve this problem, in the prior art, the organic layer of the OLED is isolated from the outside environment by using various materials that achieve a certain sealing performance. Currently, the major sealing method is as follows: filling frit in a packaging area of the upper and lower substrates of an OLED display panel in a nitrogen atmosphere, and then directly irradiating a laser emitted from a laser device onto the frit so that the high temperature generated by the laser will melt the frit and the melted material will tightly bond the upper and lower substrates, thereby achieving package of the OLED device.

However, for the above sealing method, when the frit is irradiated by the laser, it will be heated up rapid, the temperature of which may reach above 800° C. Accordingly, when the frit is cooled down rapidly, stress accumulates, which may lead to cracking of the frit in severe cases and thus result in a package failure.

SUMMARY

An objective of the embodiments of the present invention is to alleviate or avoid the package failure phenomenon in the prior art.

According to one aspect of the present invention, an embodiment of the present invention provides a packaging method which may comprise the following steps: forming a frit layer in a packaging area of a first substrate; forming at least a metal thin film and/or at least a silicon thin film on the frit layer formed on the first substrate, and forming at least a metal thin film and/or at least a silicon thin film in a packaging area of a second substrate, wherein one of the outermost thin films formed on the frit layer and the outermost thin film formed in the packaging area of the second substrate is a metal thin film, and the other is a silicon thin film; and vacuum laminating the first substrate and the second substrate.

Further, the step of forming at least a metal thin film and/or at least a silicon thin film on the frit layer formed on the first substrate and forming at least a metal thin film and/or at least a silicon thin film in a packaging area of a second substrate may comprise: forming multiple metal thin films and multiple silicon thin films on both the frit layer formed on the first substrate and the packaging area of the second substrate, wherein each metal thin film and each silicon thin film are formed alternately.

In some embodiments, the thickness of each metal thin film in the multiple metal thin films can be 2 nm-20 nm, and the thickness of each silicon thin film in the multiple silicon thin films can be 2 nm-30 nm. Theoretically, selecting thinner metal thin films and silicon thin films is more beneficial for the reactive binding between two adjacent thin film layers. However, in the present embodiment, considering the surface flatness of the substrate on which the thin films are grown, it is difficult to achieve a flatness of the substrate on a nano scale, and to select the thickness range as described above can overcome the influence of the flatness of the substrate and ensure a better sealing effect.

In an embodiment, the material for each metal thin film in the multilayer metal thin films may comprise any one or more selected from the group consisting of: Fe, Cu, Al, Au, Sn.

In an embodiment, the thickness of the frit layer can be 3 μm-10 μm.

The frit layer can be formed by screen printing, and the characteristics of the frit layer formed can be relatively more easily controlled by selecting a thickness in the range of 3 μm-10 μm, so as to avoid deformation of the final product.

In an embodiment, the vacuum level of the vacuum lamination is not higher than $10^{-5}$ Pa, and the packaging pressure can be 1 MPa-10 MPa. Selecting a vacuum level in such a range will not lead to a too high cost of the vacuum process, and the packaging pressure of 1 MPa-10 MPa can not only achieve better vacuum lamination, but also avoid damage to the display apparatus.

According to a further aspect of the present invention, an embodiment of the present invention further provide a display panel, comprising a first substrate, a second substrate and a packaging component positioned in a packaging area and provided for sealing the first substrate and the second substrate, and the packaging component comprises a frit layer positioned between the first substrate and the second substrate and a stack structure formed by a metal thin film and a silicon thin film and positioned between the frit layer and the second substrate, and the stack structure may comprise a metal silicide layer formed by the metal thin film and a silicon thin film adjacent thereto.

In one embodiment, the metal silicide layer is formed between each metal thin film and a silicon thin film adjacent thereto.

In an embodiment, the stack structure may comprise multiple metal thin films and multiple silicon thin films, and in the stack structure, each metal thin film and each silicon thin film are arranged alternately.

In an embodiment, the material for the metal thin film can comprise any one or more selected from the group consisting of: Fe, Cu, Al, Au, Sn.

Another embodiment of the present invention further provides a display apparatus which can comprise the display panel as described in any of the above embodiments.

The embodiments of the present invention achieve sealing between two substrates by forming metal thin films and silicon thin films on both the surface of the frit and the surface of the corresponding substrate and then pressurizing them in a highly vacuum environment such that each thin film reacts with each other. Since the above procedure does not require using a laser to irradiate the frit layer, adverse influences of the high temperature generated by the laser on the package can be avoided.

DETAILED DESCRIPTION OF EMBODIMENTS

The specific embodiments of the present invention will be further described in detail below with reference to the drawings and examples. The following embodiments are used to explain the present invention, rather than limit the scope of the present invention.

Figure 1:
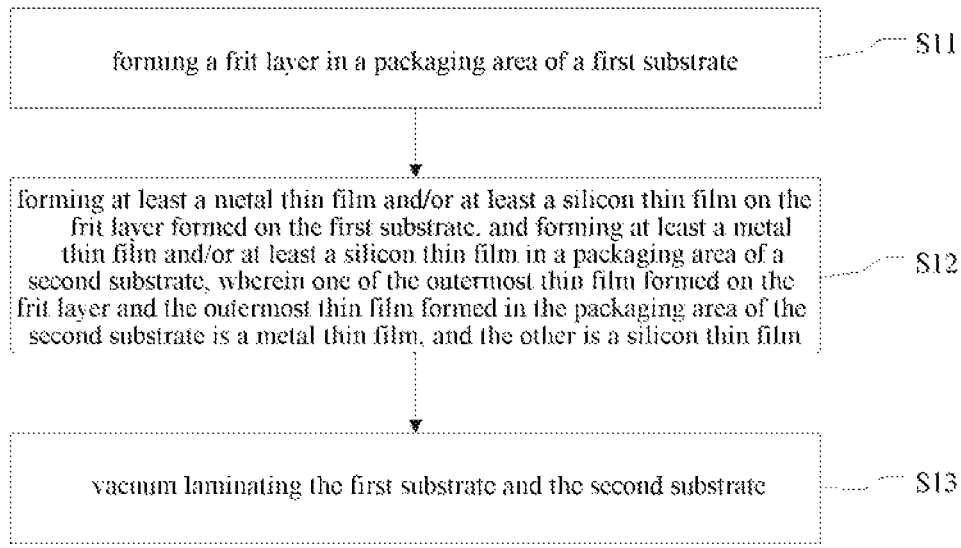
FIG. 1 is a flowchart of a packaging method provided in an embodiment of the present invention.

FIG. 1 is a flowchart of a packaging method provided in an embodiment of the present invention. The packaging method may comprise the following steps:

S11: forming a frit layer in a packaging area of a first substrate;

S12: forming at least a metal thin film and/or at least a silicon thin film on the frit layer formed on the first substrate, and forming at least a metal thin film and/or at least a silicon thin film in a packaging area of a second substrate, and one of the outermost thin film formed on the frit layer and the outermost thin film formed in the packaging area of the second substrate is a metal thin film, and the other is a silicon thin film. For example, if the outermost thin film formed on the frit layer is a metal thin film, the outermost thin film formed in the packaging area of the second substrate will be a silicon thin film, and if the outermost thin film formed on the frit layer is a silicon thin film, the outermost thin film formed in the packaging area of the second substrate will be a metal thin film.

S13: vacuum laminating the first substrate and the second substrate. Specifically, in a vacuum environment, when the first substrate and the second substrate are laminated, there will be chemical bond between the metal ions in the metal thin film and the silicon atom in the silicon thin film while they are at a certain distance from each other, so as to form a metal silicide, thereby forming a sealing structure between the first substrate and the second substrate.

The above packaging method in an embodiment of the present invention can be used for the package of an OLED display panel, and for the above packaging method, the first substrate can be either a packaging substrate (which can be a glass substrate), or an array substrate, which will not be specifically limited by the present disclosure. However, if the first substrate is a packaging substrate, the second substrate may be an array substrate, and if the first substrate is an array substrate, the second substrate may be a packaging substrate.

The packaging method provided in the embodiment of the present invention can achieve sealing between two substrates by forming metal thin films and silicon thin films on the surface of the frit as well as the surface of the corresponding substrate and then pressurizing them in a highly vacuum environment such that each thin film reacts with each other. Since such procedure does not require using a laser to irradiate the frit layer, and adverse influences of the high temperature generated by the laser on the package can be avoided.

During step S12 of the above packaging method, multiple metal thin films and multiple silicon thin films can be formed on both the frit layer formed on the first substrate and the packaging area of the second substrate, and each metal thin film and each silicon thin film are formed alternately.

Figure 2:
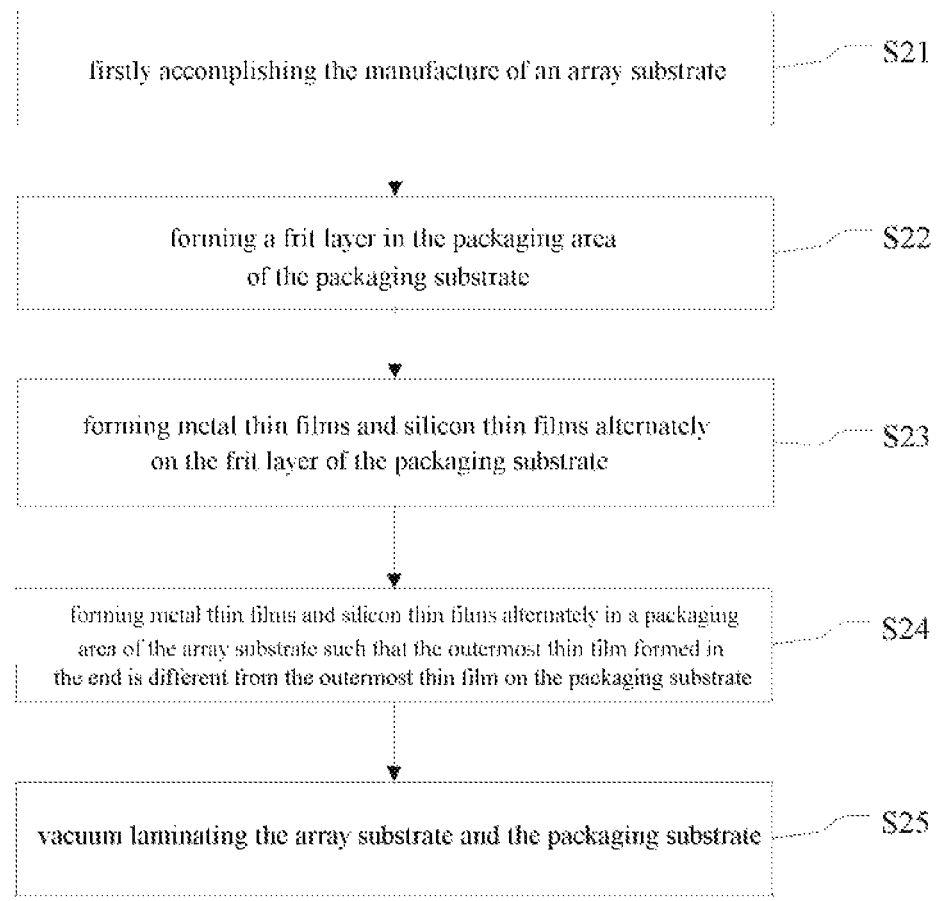
FIG. 2 is a manufacture flowchart of an OLED display panel provided in an embodiment of the present invention.

For example, when the above packaging method is used for the package of an OLED display panel and the frit layer is formed on a packaging substrate, as shown in FIG. 2, an exemplary manufacture flowchart of the OLED display panel may comprise the following steps:

S21: accomplishing the manufacture of an array substrate. The manufacture of the array substrate may comprise: manufacturing an array of thin film transistors (TFT) on a base substrate, and then sequentially depositing thereon structures such as organic materials of different functions and a metal cathode to obtain an OLED device.

S22: forming a frit layer in a packaging area of a packaging substrate. This step may comprise: cleaning the packaging substrate in a vacuum environment, then forming glass cement matching the packaging area of the array substrate in the packaging area of the packaging substrate by dispensing or printing, and then sintering the packaging substrate in a high-temperature furnace to remove the solvent in the glass cement and obtain a pattern of the frit (the frit layer). The pattern of the frit can be in a strip shape with a width of 0.5 mm-3.0 mm, e.g., 1.0 mm, 2.0 mm or the like, and a thickness of 3 µm-10 µm, e.g., 5 µm, 6 µm, 7 µm, 8 µm, 9 µm or the like.

S23: forming metal thin films and silicon thin films alternately on the frit layer formed on the packaging substrate.

Each metal thin film can be manufactured by means of a sputtering process. For example, first, a thin film of metals such as Fe, Cu, Al, Au, or Sn can be deposited on the frit layer formed on the packaging substrate by using a sputtering process, and meanwhile the pattern of the metal thin film can be controlled by means of a metal mask such that the metal thin film is deposited on the frit layer in the packaging area. The thickness of each metal thin film can be 2 nm-20 nm, e.g., 5 nm, 8 nm, 12 nm, 15 nm, 18 nm or the like.

Each silicon thin film can be manufactured by using an ion beam process. For example, after a metal thin film is manufactured, a silicon thin film is deposited by using an ion beam process on the metal thin film that has been formed, and meanwhile the pattern of the silicon thin film can be controlled by means of a metal mask such that the silicon thin film is deposited on the metal thin film in the packaging area. The thickness of each silicon thin film can be 2 nm-30 nm (e.g., 8 nm, 15 nm, 18 nm, 25 nm, 28 nm or the like).

The sequence of forming a metal thin film and a silicon thin film will not be specifically limited by the present invention. In the embodiments of the present invention, a silicon thin film can be formed either before or after the formation of a metal thin film.

With the above method, multiple metal thin films and multiple silicon thin films can be formed alternately on the frit layer formed on the packaging substrate. In an embodiment, the number of the metal thin films to be formed can be 2 or 3, and the number of the silicon thin films to be formed can be 2 or 3.

S24: forming metal thin films and silicon thin films alternately in the packaging area of the array substrate such that the outermost thin film formed is different from the outermost thin film on the packaging substrate (i.e., one is a metal thin film, and the other is a silicon thin film).

The method of forming metal thin films and silicon thin films on the array substrate can be identical to that in step S23, which will not be described again herein. In one embodiment, on the array substrate, the number of the metal thin films to be formed can be 2 or 3, and the number of the silicon thin films to be formed can be 2 or 3.

The sequence of forming activation thin films (i.e., the metal thin films and the silicon thin films as mentioned above) on the array substrate and the packaging substrate will not be specifically limited by the present invention, i.e., they can be formed first on the packaging substrate and then on the array substrate, or first on the array substrate and then on the packaging substrate, or simultaneously on both.

S25: vacuum laminating the array substrate and the packaging substrate. For example, the array substrate and the packaging substrate can be precisely aligned with each other in a vacuum device, where the vacuum level can be controlled under $10^{-5}$ Pa, and then the two substrates are tightly laminated by mechanical lamination, and the packaging pressure can be set as 1 MPa-10 MPa, e.g., 3 MPa, 5 MPa, 6 MPa, 8 MPa or the like. Under such packaging pressure, there will be chemical bond between the metal ions in the metal thin film and the silicon atom in the silicon thin film when they are at a certain distance from each other, so as to form a metal silicide, thereby forming a sealing structure between two substrates. Accordingly, the package of the two substrates is accomplished.

As for the manufacture flow of an OLED display panel where a frit layer is formed on an array substrate, the specific method is similar to the above steps S21-S25, which will not be described again herein.

The packaging method provided in the embodiments of the present invention achieves sealing by depositing activation thin films on both the surface of the frit and the surface of the corresponding substrate and then pressurizing them in a highly vacuum environment such that the activation thin films between two substrates react with each other, instead of by using a packaging method adopting laser irradiation to melt and sinter the frit. Thus adverse influences of the high temperature generated by the laser on the package can be avoided. In addition, as compared with the packaging method using laser irradiation in the prior art, the embodiments of the present invention can complete the package by one lamination without divisional irradiation using a laser, which greatly reduces the production time and cuts down the production cost. Moreover, since a high-temperature process is avoided in the final sealing process, there can be more space for the design of the OLED products, for instance, the product design of a narrow-frame OLED can be achieved, and organic materials can also be filled between the packaging substrate and the OLED device to enhance the packaging strength.

Figure 3:
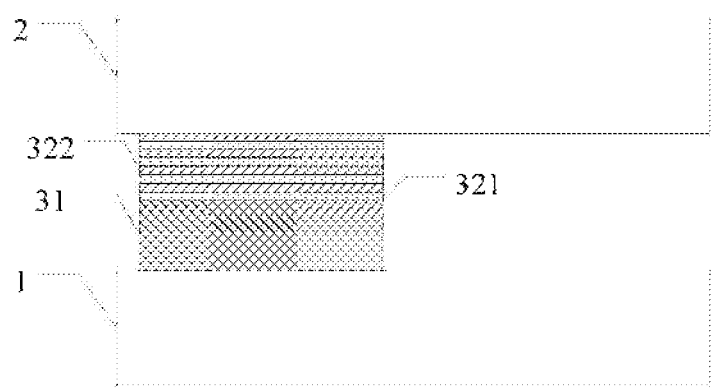
FIG. 3 is a schematic view of a display panel provided in an embodiment of the present invention.

FIG. 3 is a schematic view of a display panel provided in an embodiment of the present invention. The display panel provided in the embodiment may comprise a first substrate 1, a second substrate 2, and a packaging component positioned in a packaging area and provided for sealing the first substrate 1 and the second substrate 2. The packaging component may comprise a frit layer 31 positioned between the first substrate 1 and the second substrate 2, and a stack structure formed by a metal thin film 321 and a silicon thin film 322 and positioned between the frit layer 31 and the second substrate 2, the stack structure may comprise a metal silicide layer formed by a metal thin film 321 and a silicon thin film adjacent thereto.

In one embodiment, the metal thin film 321 and the silicon thin film 322 adjacent thereto can react with each other completely in a suitable condition such that the metal thin film and the silicon thin film all form a metal silicide layer.

It should be understood that in some situations, the chemical reaction can take place only partly between the metal thin film 321 and the silicon thin film 322 adjacent thereto, forming metal silicide partly. In other words, in a further embodiment, the metal silicide layer can be formed between each metal thin film and the silicon thin film adjacent thereto. The display panel in the embodiment of the present invention can be an OLED display panel, and in this display panel, the first substrate can be either a packaging substrate or an array substrate, which will not be specifically limited here. However, if the first substrate is a packaging substrate, the second substrate is an array substrate, and if the first substrate is an array substrate, the second substrate is a packaging substrate.

In one embodiment as shown in FIG. 3, the stack structure may comprise multiple metal thin films and multiple silicon thin films, and in the stack structure, each metal thin film and each silicon thin film are alternately arranged The material for the metal thin films can be any one or more selected from the group consisting of: Fe, Cu, Al, Au, Sn.

Further, an embodiment of the present invention provides a display apparatus, comprising the above display panel. The display apparatus provided in the embodiment of the present invention can be any product or component having display function, such as a display screen of a notebook computer, a liquid crystal display, a liquid crystal television, a digital photo frame, a mobile phone, a tablet computer, and the like.

The above embodiments are used only for purposes of explanation and not for limitation of the present invention. Those having ordinary skill in the art can may further achieve various modifications and variations to those embodiments without departing from the spirit and the scope of the present invention. Therefore, all equivalent technical solutions shall also fall within the scope of the present invention. The patent protection scope of the present invention should be defined by the appended claims.

The invention claimed is:
1. A packaging method, comprising:
forming a frit layer in a packaging area of a first substrate;
forming metal thin films and silicon thin films being in direct contact with each other and alternatively arranged on the fit layer formed on the first substrate, and forming metal thin films and silicon thin films being in direct contact with each other and alternatively arranged in a packaging area of a second substrate, wherein the innermost thin film that directly contacts the frit layer is a metal thin film, and the innermost thin film that directly contacts the packaging area of the second substrate is a silicon thin film, and wherein one of the outermost thin films formed on the fit layer and the outermost thin film formed in the packaging area of the second substrate is a metal thin film, and the other is a silicon thin film; and
vacuum laminating the first substrate and the second substrate, such that a metal silicide layer is generated by the outermost thin film formed on the frit layer and the outermost thin film formed in the packaging area of the second substrate.

2. The packaging method according to claim 1, wherein the step of forming at least one of a metal thin film and a silicon thin film on the fit layer formed on the first substrate, and forming at least one of a metal thin film and a silicon thin film in a packaging area of a second substrate comprises:

forming multiple metal thin films and multiple silicon thin films on both the fit layer formed on the first substrate and the packaging area of the second substrate, wherein each metal thin film and each silicon thin film are formed alternately.

3. The packaging method according to claim 2, wherein the thickness of each metal thin film in the multiple metal thin films is 2 nm-20 nm, and the thickness of each silicon thin film in the multiple silicon thin films is 2 nm-30 nm.

4. The packaging method according to claim 2, wherein the material for each metal thin film in the multiple metal thin films comprises at least one selected from the group consisting of: Fe, Cu, Al, Au, Sn.

5. The packaging method according to claim 3, wherein the material for each metal thin film in the multiple metal thin films comprises at least one selected from the group consisting of: Fe, Cu, Al, Au, Sn.

6. The packaging method according to claim 1, wherein the thickness of the frit layer is 3 μm to 10 μm.

7. The packaging method according to claim 1, wherein the vacuum level of the vacuum lamination is not higher than $10^{-5}$ Pa, and the packaging pressure is 1 MPa and 10 MPa.

8. A display panel, comprising
a first substrate;
a second substrate;
and a packaging component positioned in a packaging area and provided for sealing the first substrate and the second substrate, wherein the packaging component comprises a frit layer positioned between the first substrate and the second substrate and a stack structure positioned between the frit layer and the second substrate, the stack structure includes metal thin films and silicon thin films that are alternatively arranged and in direct contact with each other, and wherein the stack structure further comprises a metal silicide layer formed by the metal thin film and a silicon thin film adjacent thereto, wherein in the stack structure, the innermost thin film that directly contacts the frit layer is a metal thin film, and the innermost thin film that directly contacts the second substrate is a silicon thin film.

9. The display panel according to claim 8, wherein the metal silicide layer is formed between each metal thin film and a silicon thin film adjacent thereto.

10. The display panel according to claim 9, wherein the stack structure comprises multiple metal thin films and multiple silicon thin films, and in the stack structure, each metal thin film and each silicon thin film are arranged alternately.

11. The display panel according to claim 10, wherein the material for the metal thin film comprises any one or more selected from the group consisting of: Fe, Cu, Al, Au, Sn.

12. A display apparatus, comprising the display panel according to claim 8.

13. A display apparatus, comprising the display panel according to claim 9.

14. A display apparatus, comprising the display panel according to claim 10.

15. A display apparatus, comprising the display panel according to claim 11.

* * * * *